(12) United States Patent
Lee

(10) Patent No.: US 8,908,447 B2
(45) Date of Patent: Dec. 9, 2014

(54) SEMICONDUCTOR DEVICE AND DATA OUTPUT CIRCUIT THEREFOR

(71) Applicant: SK Hynix Inc., Icheon-si Gyeonggi-do (KR)

(72) Inventor: Sang Ho Lee, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 13/720,612

(22) Filed: Dec. 19, 2012

(65) Prior Publication Data

US 2014/0063979 A1   Mar. 6, 2014

(30) Foreign Application Priority Data

Aug. 28, 2012   (KR) ........................ 10-2012-0094395

(51) Int. Cl.
| | |
|---|---|
| *G11C 7/06* | (2006.01) |
| *G11C 7/10* | (2006.01) |
| *G11C 11/4091* | (2006.01) |
| *G11C 11/4097* | (2006.01) |

(52) U.S. Cl.
CPC .............. *G11C 7/062* (2013.01); *G11C 7/1006* (2013.01); *G11C 11/4091* (2013.01); *G11C 11/4097* (2013.01)
USPC ............ 365/189.07; 365/189.09; 365/187.17; 365/207

(58) Field of Classification Search
CPC .................................. G11C 7/062; G11C 7/10
USPC .................. 365/189.07, 189.09, 189.17, 207
See application file for complete search history.

(56) References Cited

U.S. PATENT DOCUMENTS

| | | | | |
|---|---|---|---|---|
| 5,696,730 | A  * | 12/1997 | Slezak et al. .................. | 365/227 |
| 5,969,998 | A  * | 10/1999 | Oowaki et al. ........... | 365/189.09 |
| 6,115,316 | A  * | 9/2000 | Mori et al. ............... | 365/230.03 |
| 6,333,884 | B1 * | 12/2001 | Kato et al. ..................... | 365/208 |
| 6,600,692 | B2 * | 7/2003 | Tanzawa ....................... | 365/226 |
| 7,333,378 | B2 * | 2/2008 | Sim ................................ | 365/203 |
| 7,594,148 | B2 * | 9/2009 | Do ................................. | 714/718 |
| 2003/0103397 | A1 * | 6/2003 | Lee ............................... | 365/203 |
| 2006/0002206 | A1 * | 1/2006 | Raad et al. .................... | 365/201 |
| 2006/0023483 | A1 * | 2/2006 | Lee et al. ........................ | 365/63 |
| 2007/0195625 | A1 * | 8/2007 | Lee ............................... | 365/205 |

(Continued)

FOREIGN PATENT DOCUMENTS

| | | |
|---|---|---|
| KR | 100425476 B1 | 3/2004 |
| KR | 1020120003608 A | 1/2012 |

*Primary Examiner* — Fernando Hidalgo
(74) *Attorney, Agent, or Firm* — William Park & Associates Patent Ltd.

(57) ABSTRACT

A semiconductor device includes a memory cell array configured to include a plurality of memory cells connected between a plurality of bit lines and a plurality of word lines, a bit line sense amplifier connected to a bit line of the bit lines and configured to amplify data stored in a selected memory cell and transfer the amplified data to a segment I/O line, a control signal generator configured to determine a level of an I/O switch control signal in response to a level of a power source voltage, and a local sense amplifier connected between the segment I/O line and an local I/O line and configured to couple or separate the segment I/O line and the local I/O line in response to the I/O switch control signal, amplify the data transferred to the segment I/O line, and supply the amplified data to the local I/O line.

14 Claims, 3 Drawing Sheets

(56) References Cited

U.S. PATENT DOCUMENTS

| | | | |
|---|---|---|---|
| 2008/0037333 A1* | 2/2008 | Kim et al. | 365/189.02 |
| 2008/0130383 A1* | 6/2008 | Kushida | 365/191 |
| 2011/0007583 A1* | 1/2011 | Lee et al. | 365/189.17 |
| 2011/0007584 A1* | 1/2011 | Hwang | 365/191 |
| 2011/0069568 A1* | 3/2011 | Shin et al. | 365/194 |
| 2011/0211407 A1* | 9/2011 | Chou | 365/203 |
| 2012/0002492 A1* | 1/2012 | Choi | 365/189.17 |
| 2012/0005397 A1* | 1/2012 | Lim et al. | 710/316 |

* cited by examiner

US 8,908,447 B2

SEMICONDUCTOR DEVICE AND DATA OUTPUT CIRCUIT THEREFOR

CROSS-REFERENCES TO RELATED APPLICATION

The present application claims priority under 35 U.S.C. §119(a) to Korean application number 10-2012-0094395, filed on Aug. 28, 2012, in the Korean Intellectual Property Office, which is incorporated herein by reference in its entirety.

BACKGROUND

1. Technical Field

The present invention generally relates to a semiconductor integrated circuit, and more particularly, to a semiconductor device and a data output circuit therefor.

2. Related Art

In general, a semiconductor memory device performs an operation of reading data from a memory cell in response to an address and a read command received from a controller and performs an operation of writing data into a memory cell in response to an address and a write command received from the controller.

When a semiconductor memory device performs a read operation, a data signal outputted from a memory cell has potential of a very fine level. Accordingly, a logic level of this fine signal is determined by plural times of sense amplification circuits.

Meanwhile, a semiconductor memory device gradually requires lower power, and thus operating power for the semiconductor memory device is lowered. Accordingly, a high-performance data output device is necessary because a voltage level of a signal outputted from a memory cell becomes finer.

FIG. 1 shows a schematic construction of the data output circuit of a common semiconductor device. The data output circuit can include a bit line sense amplifier (BLSA) 101, a local sense amplifier (LSA) 103, an input/output sense amplifier (IOSA) 105, and an input/output buffer (I/O buffer) 107.

When a corresponding word line (not shown) is enabled in response to an address from a controller, data stored in a memory cell (not shown) is loaded onto a bit line pair BL and BLB. The BLSA 101 amplifies voltage corresponding to electric charges that are stored in the memory cell. The data amplified by the BLSA 101 is transferred to a pair of segment input/output lines SIO and SIOB when a column select signal YI is enabled.

The LSA 103 amplifies the data loaded onto the pair of segment I/O lines SIO and SIOB and supplies the amplified data to the IOSA 105 through a pair of local input/output lines LIO and LIOB. The IOSA 105 amplifies the received data again and sends the amplified data to a global input/output line GIO so that the data is externally outputted through the I/O buffer 107.

FIG. 2 shows the construction of a common LSA, and FIG. 3 is a timing diagram illustrating a data output method in a common semiconductor device.

Referring to FIG. 2, the LSA 103 can include an amplification unit 1031 for amplifying data loaded onto the pair of segment I/O lines SIO and SIOB and a switching unit 1033 for coupling or separating the pair of segment I/O lines SIO and SIOB and the pair of local I/O lines LIO and LIOB. FIG. 2 also illustrates, a terminal ground voltage Vss and a transistors T1 to T7.

The switching unit 1033 couples or separates the pair of segment I/O lines SIO and SIOB and the pair of local I/O lines LIO and LIOB in response to an I/O switch control signal IOSW. Particularly, the switching unit 1033 is configured to couple the pair of segment I/O lines SIO and SIOB and the pair of local I/O lines LIO and LIOB so that data is transmitted when a write operation is performed and configured to separate the pair of segment I/O lines SIO and SIOB and the pair of local I/O lines LIO and LIOB so that a differential amplification signal loaded onto the pair of segment I/O lines SIO and SIOB is transmitted to the pair of local I/O lines LIO and LIOB when a read operation is performed.

The data output method of the semiconductor device is described below with reference to FIGS. 1 to 3.

When a corresponding word line is enabled in response to an active command ACT (i.e., <ACT>), charge sharing is generated between a selected memory cell and the bit line BL, and thus a voltage difference is generated between the bit line BL and the bit line bar BLB. Furthermore, when the BLSA 101 is enabled, it amplifies the voltage difference between the pair of bit lines BL and BLB.

When a read command READ (i.e., <READ>) is enabled after RAS (i.e., row address strove/select) to CAS (i.e., column address strobe/select) delay (tRCD), the column select signal YI is enabled (i.e., YI(RD)). After a lapse of a specific time, an LSA enable signal LSAEN is enabled.

When a read operation is performed, the I/O switch control signal IOSW remains off. When the LSA enable signal LSAEN is enabled, the transistors T3, T4, and T7 of the amplification unit 1031 are turned on. At this time, assuming that a logic state of data transmitted from the memory cell to the segment I/O line SIO is a high level (i.e., "H" Data) and a logic state of data transmitted from the memory cell to the segment I/O line bar SIOB is a low level (i.e., "L" Data), the transistor T5 of the amplification unit 1031 is turned on. Thus, a voltage level of the local I/O line bar LIOB is amplified to a low level and voltages levels of the pair of local I/O lines LIO and LIOB are amplified by a specific voltage difference.

As described above, the transistors T1 and T2 of the switching unit 1033 that are controlled in response to the I/O switch control signal IOSW are turned off when a read operation is performed, thus separating the pair of segment I/O lines SIO and SIOB and the pair of local I/O lines LIO and LIOB. Here, if the pair of segment I/O lines SIO and SIOB adjacent to each other has different data topologies, a coupling phenomenon is generated because the pair of segment I/O lines SIO and SIOB separated by the I/O switch control signal IOSW has a small potential load. In this case, a data read failure can be generated because the potentials of the pair of segment I/O lines SIO and SIOB are influenced by the coupling phenomenon.

Furthermore, as a power source voltage VDD rises, a failure probability increases because a coupling effect between the segment I/O lines is further increased.

SUMMARY

In an embodiment, a semiconductor device can include a memory cell array configured to include a plurality of memory cells connected between a plurality of bit lines and a plurality of word lines, a bit line sense amplifier (BLSA) connected to a bit line of the bit lines and configured to amplify data stored in a selected memory cell and transfer the amplified data to a segment input/output (I/O) line, a control signal generator configured to determine a level of an I/O switch control signal in response to a level of a power source voltage, and a local sense amplifier (LSA) connected between the segment I/O line and an local I/O line and configured to couple or separate the segment I/O line and the local I/O line in response to the I/O switch control signal, amplify the data transferred to the segment I/O line, and supply the amplified data to the local I/O line.

In an embodiment, a data output circuit includes an LSA configured to receive data, sensed and amplified by a BLSA, through a segment I/O line, provide the received data to a local I/O line, and couple or separate the segment I/O line and the local I/O line in response to an I/O switch control signal and a control signal generator configured to determine a level of the I/O switch control signal in response to a level of a power source voltage.

BRIEF DESCRIPTION OF THE DRAWINGS

Features, aspects, and embodiments are described in conjunction with the attached drawings, in which.

DETAILED DESCRIPTION

Hereinafter, a semiconductor device and a data output circuit therefor according to various embodiments will be described below with reference to the accompanying drawings through the embodiments.

Figure 4:
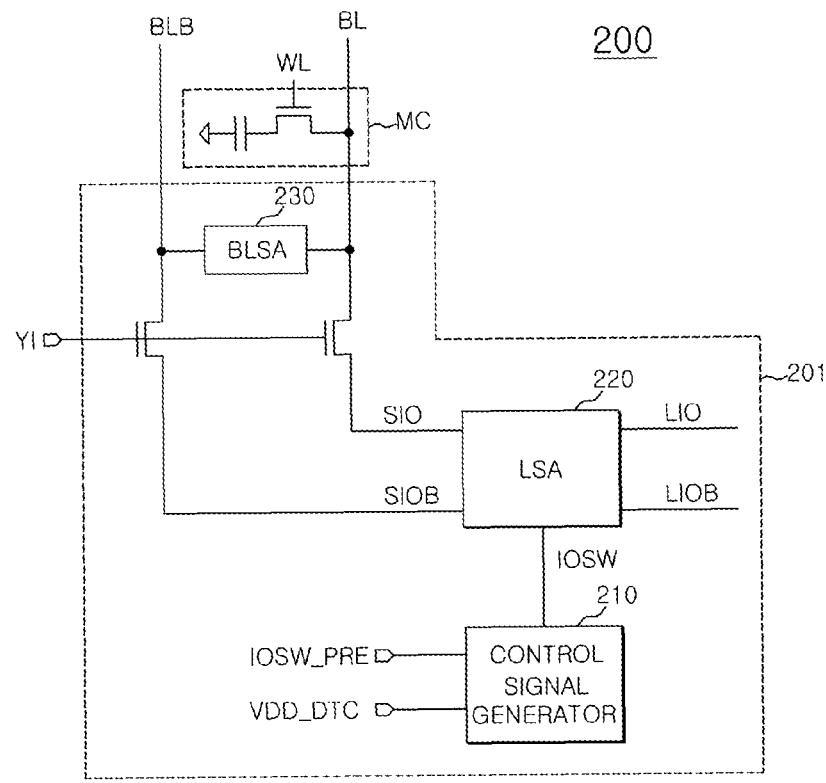
FIG. 4 shows the construction of a semiconductor device in is accordance with an embodiment.

FIG. 4 shows the construction of a semiconductor device in accordance with an embodiment.

Referring to FIG. 4, the semiconductor device 200 in accordance with an embodiment may include a memory cell MC connected between a bit line BL and a word line WL and a data output circuit 201 configured to sense data stored in the memory cell MC and output the sensed data.

The data output circuit 201 can further include a control signal generator 210, an LSA 220, and a BLSA 230.

The control signal generator 210 may generate an I/O switch control signal IOSW in response to a pre-switching control signal IOSW_PRE and a level detection signal VDD_DTC.

The LSA 220 may be connected between a pair of segment I/O lines SIO and SIOB and a pair of local I/O lines LIO and LIOB and may be configured to couple or separate the pair of segment I/O lines SIO and SIOB and the pair of local I/O lines LIO and LIOB in response to the I/O switch control signal IOSW of the control signal generator 210. Furthermore, the LSA 220 may be configured to amplify potentials of the pair of segment I/O lines SIO and SIOB and load the amplified potentials onto the pair of local I/O lines LIO and LIOB.

Additionally, the BLSA 230 may amplify a voltage difference between the pair of bit lines BL and BLB when a read operation is performed and may transfer potentials, loaded onto the pair of bit lines BL and BLB, to the pair of segment I/O lines SIO and SIOB when the column select signal YI is enabled.

That is, the data output circuit 201 in accordance with an embodiment may be configured to enable or disable the I/O switch control signal IOSW variably depending on a level of the power source voltage VDD without always disabling the I/O switch control signal IOSW when a read operation is performed.

Accordingly, when a level of the power source voltage VDD is a specific level VREF (i.e., reference voltage) or higher, in order to attenuate a coupling effect between the pair of segment I/O lines SIO and SIOB, the I/O switch control signal IOSW is generated so that the pair of segment I/O lines SIO and SIOB and the pair of local I/O lines LIO and LIOB are coupled. As a result, coupling capacitance is generated between the pair of segment I/O lines SIO and SIOB and the pair of local I/O lines LIO and LIOB in addition to the coupling capacitance between the pair of segment I/O lines SIO and SIOB. The parasitic components generate mutual attenuation, thereby being capable of a coupling effect between the pair of segment I/O lines SIO and SIOB.

To this end, the control signal generator 210 may be formed of an OR gate so that it operates as in Table 1 below, but not limited thereto.

TABLE 1

| VDD LEVEL | IOSW_PRE | VDD_DTC | IOSW |
|---|---|---|---|
| LOW VDD | L | L | L |
| HIGH VDD | L | H | H |

Figure 1:
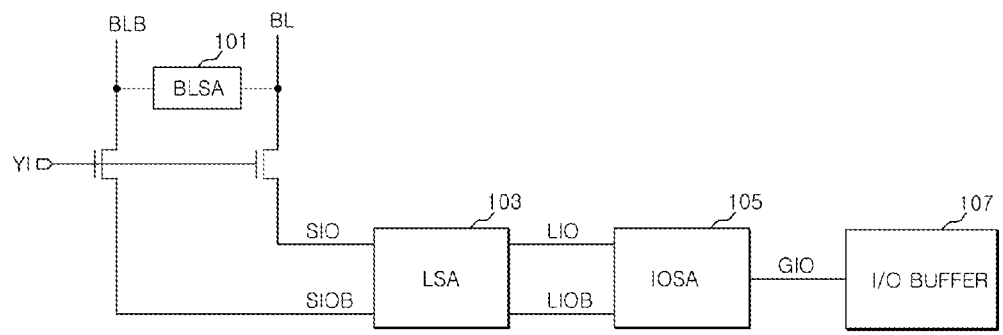
FIG. 1 shows a schematic construction of the data output circuit of a common semiconductor device.
Figure 2:
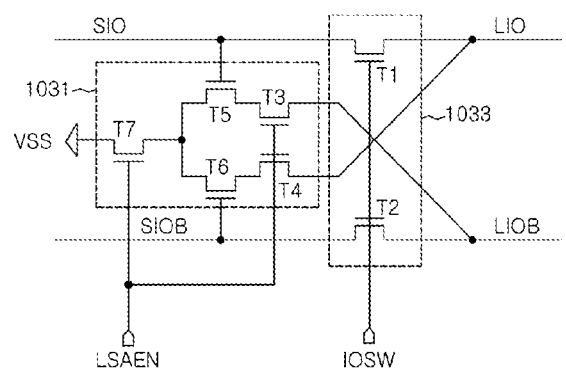
FIG. 2 shows the construction of a common LSA.
Figure 3:
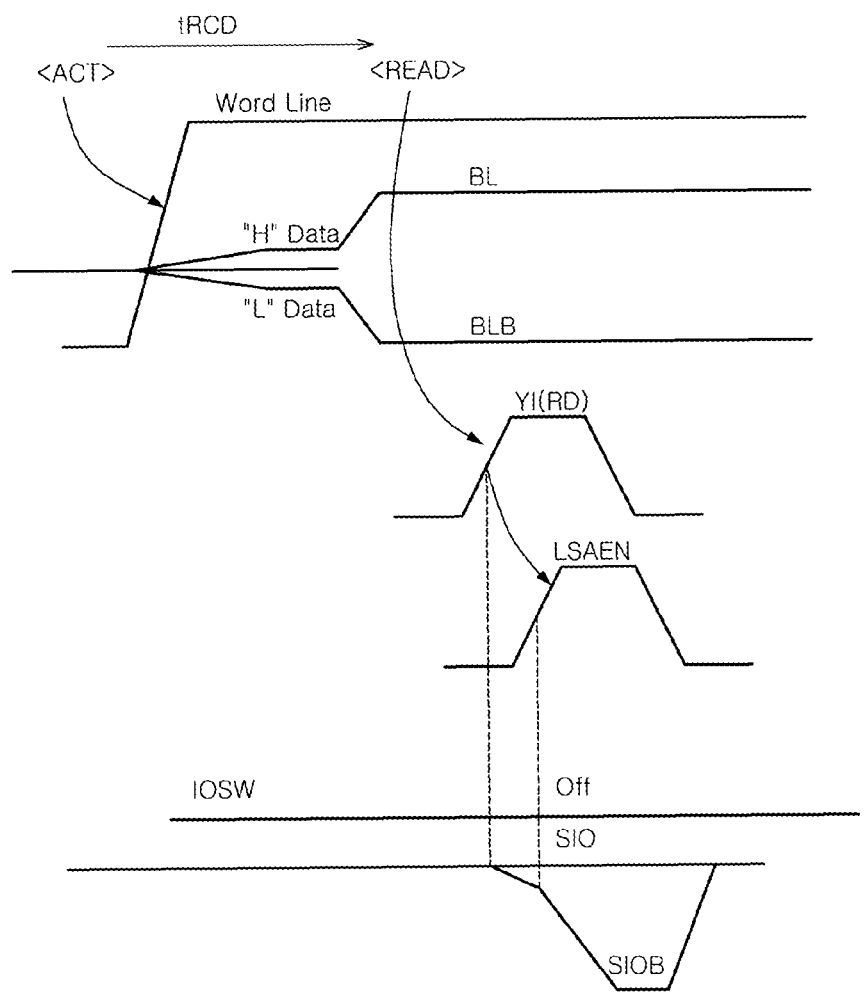
FIG. 3 is a timing diagram illustrating a data output method in a common semiconductor device.

Additionally, the LSA 220 of FIG. 4 can adopt the structure of FIG. 2, for example, but not limited thereto.

Figure 5:
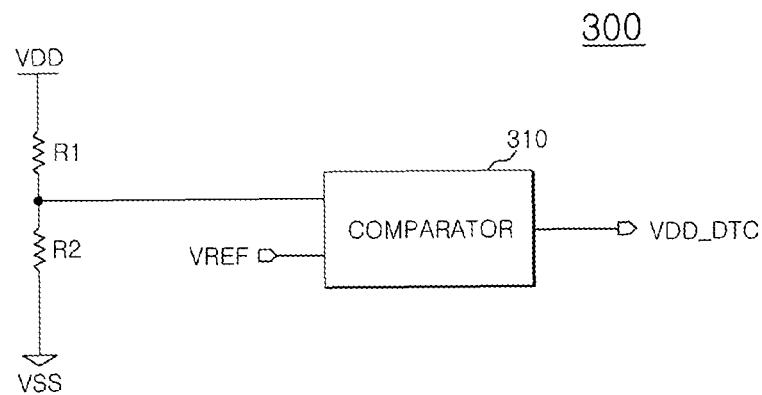
FIG. 5 is one exemplary diagram of a level detection unit to which the various embodiments are applied.

Furthermore, a circuit for detecting a level of the power source voltage VDD and generating the level detection signal VDD_DTC based on the detected level can be configured as shown in FIG. 5.

FIG. 5 is one exemplary diagram of a level detection unit to which the embodiments may be applied.

As shown in FIG. 5, the level detection unit 300 may include voltage dividers R1 and R2 coupled in series between a terminal for the power source voltage VDD and a terminal for ground voltage VSS and a comparator 310 configured to compare the output voltage of the voltage dividers R1 and R2 with the reference voltage VREF and generate the level detection signal VDD_DTC based on a result of the comparison.

A circuit for detecting a voltage level is not limited to the circuit of FIG. 5, but one of various known circuits can be used as the circuit for detecting a voltage level.

The data output operation of the above-described semiconductor device is described below. In the following description, it is assumed that the LSA of FIG. 2, for example, has been adopted as the LSA 220.

When a corresponding word line WL is enabled in response to an active command ACT, charge sharing is generated at a selected memory cell MC and the bit line BL, with the result that a voltage difference is generated between the bit line BL and the bit line bar BLB. When the BLSA 230 is enabled, it amplifies the voltage difference between the pair of bit lines BL and BLB.

When a read command READ is enabled after a specific time (e.g., RAS to CAS delay (tRCD), a column select signal YI is enabled. Next, the LSA enable signal LSAEN is enabled.

The LSA 220 in accordance with the embodiments couples or separates the pair of segment I/O lines SIO and SIOB and the pair of local I/O lines LIO and LIOB in response to the I/O switch control signal IOSW generated from the control signal generator 210. Here, it is assumed that a logic state of data transmitted from the memory cell MC to the segment I/O line SIO is a high level and the power source voltage VDD is higher than the reference voltage VREF. In this case, the I/O switch control signal IOSW is enabled to a high level, for example, thereby turning on the transistors T1 and T2 of the switching unit 1033. Thus, the pair of segment I/O lines SIO and SIOB and the pair of local I/O lines LIO and LIOB are coupled. Furthermore, the transistors T3, T4, T5, and T7 of the amplification is unit 1031 are turned on.

Since the pair of segment I/O lines SIO and SIOB and the pair of local I/O lines LIO and LIOB are coupled, parasitic capacitance due to the pair of local I/O lines LIO and LIOB is generated in the pair of segment I/O lines SIO and SIOB. Since the power source voltage VDD is assumed to be higher than the reference voltage VREF, parasitic capacitance between the pair of segment I/O lines SIO and SIOB can be offset by the parasitic capacitance between the pair of local I/O lines LIO and LIOB. As a result, the LSA 220 can precisely detect and amplify data. Furthermore, the data amplified by the LSA 220 is transferred to the pair of local I/O lines LIO and LIOB, amplified by a specific potential difference, and then externally outputted.

That is, in accordance with the embodiments, when a data read operation is performed, a coupling phenomenon can be removed by determining whether to couple or separate the pair of segment I/O lines SIO and SIOB and the pair of local I/O lines LIO and LIOB in response to a level of the external power source voltage VDD. Accordingly, operational reliability can be improved because the output margin of the data output circuit can be maximized.

Additionally, although only one memory cell MC is illustrated in FIG. 4, the semiconductor device 200 includes a memory cell array including a plurality of memory cells connected between a plurality of bit lines and a plurality of word lines. Furthermore, although only parts corresponding to the gist of the embodiments, from among the elements of the data output circuit, are illustrated in FIG. 4, the data output circuit can further include an input/output sense amplifier (IOSA) and an output buffer. It will be also evident that the semiconductor device of FIG. 4 can include a controller, a row decoder, a column decoder, etc. in order to perform various operations.

While various embodiments have been described above, it will be understood to those skilled in the art that the embodiments described are by way of example only. Accordingly, the semiconductor device and the data output circuit therefor described herein should not be limited based on the described embodiments.

What is claimed is:

1. A semiconductor device, comprising:
    a memory cell array configured to comprise a plurality of memory cells connected between a plurality of bit lines and a plurality of word lines;
    a bit line sense amplifier (BLSA) connected to a bit line of the bit lines and configured to amplify data stored in a selected memory cell and transfer the amplified data to a segment input/output (I/O) line;
    a control signal generator configured to output an I/O switch control signal in response to a pre-switching control signal and a level detection signal determined by a level of a power source voltage; and
    a local sense amplifier (LSA) connected between the segment I/O line and an local I/O line and configured to couple or separate the segment I/O line and the local I/O line in response to the I/O switch control signal, amplify the data transferred to the segment I/O line, and supply the amplified data to the local I/O line,
    wherein the pre-switching control signal is configured to have a predetermined level when a read operation is performed, and the control signal generator is configured to output the I/O switch control signal regardless of a level of the pre-switching control signal.

2. The semiconductor device according to claim 1, wherein the control signal generator comprises an OR gate for receiving the pre-switching control signal and a level detection signal and outputting the I/O switch control signal.

3. The semiconductor device according to claim 1, further comprising a level detection unit configured for receiving the power source voltage and generating the level detection signal.

4. The semiconductor device according to claim 3, wherein the level detection unit comprises:
    voltage dividers coupled in series between a terminal for the power source voltage and a terminal for a ground voltage; and
    a comparator configured to compare an output voltage of the voltage dividers with a reference voltage and generate the level detection signal based on a result of the comparison.

5. The semiconductor device according to claim 1, wherein the control signal generator determines the level of the I/O switch control signal so that the segment I/O line and the local I/O line are coupled when the level of the power source voltage is higher than a reference voltage.

6. The semiconductor device according to claim 1, wherein the control signal generator determines the level of the I/O switch control signal so that the segment I/O line and the local I/O line are separated when the level of the power source voltage is a reference voltage or lower.

7. The semiconductor device according to claim 1, wherein the LSA comprises:
    an amplification unit configured to detect a level of the data loaded onto the segment I/O line, amplify the detected data, and transfer the amplified data to the local I/O line; and
    a switching unit driven in response to the I/O switch control signal and configured to couple or separate the segment I/O line and the local I/O line.

8. The semiconductor device according to claim 1, wherein the BLSA is configured to amplify data stored in a selected memory cell and transfer the amplified data to the segment input/output (I/O) line after receiving a column select signal (Y1).

9. A data output circuit, comprising:
    a local sense amplifier (LSA) configured to receive data, sensed and amplified by a bit line sense amplifier (BLSA), through a segment input/output (I/O) line, provide the received data to a local I/O line, and couple or separate the segment I/O line and the local I/O line in response to an I/O switch control signal; and
    a control signal generator configured to output the I/O switch control signal in response to a pre-switching control signal and a level detection signal determined by a level of a power source voltage,
    wherein the pre-switching control signal is configured to have a predetermined level when a read operation is performed, and the control signal generator is configured to output the I/O switch control signal regardless of a level of the pre-switching control signal.

10. The data output circuit according to claim 9, wherein the LSA comprises:
    an amplification unit configured to detect a level of the data loaded onto the segment I/O line, amplify the detected data, and transfer the amplified data to the local I/O line; and a switching unit driven in response to the I/O switch control signal and configured to couple or separate the segment I/O line and the local I/O line.

11. The data output circuit according to claim 9, wherein the control signal generator comprises an OR gate for receiving the pre-switching control signal and the level detection signal and outputting the I/O switch control signal.

12. The data output circuit according to claim 9, wherein the control signal generator determines the level of the I/O switch control signal so that the segment I/O line and the local I/O line are coupled when the level of the power source voltage is higher than a reference voltage.

13. The data output circuit according to claim 9, wherein the control signal generator determines the level of the I/O switch control signal so that the segment I/O line and the local I/O line are separated when the level of the power source voltage is a reference voltage or lower.

14. The data output circuit according to claim 9, wherein the BLSA is configured to amplify the data and transfer the amplified data to the segment I/O line when a column select signal is enabled.

* * * * *